(12) United States Patent
Stoica et al.

(10) Patent No.: US 11,733,060 B2
(45) Date of Patent: Aug. 22, 2023

(54) DIAGNOSIS OF ELECTRICAL FAILURES IN CAPACITIVE SENSORS

(71) Applicant: Infineon Technologies AG, Neubiberg (DE)

(72) Inventors: Dan-Ioan-Dumitru Stoica, Buchare (RO); Constantin Crisu, Bucharest (RO); Victor Popescu-Stroe, Bucharest (RO); Bernhard Winkler, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 195 days.

(21) Appl. No.: 17/171,283

(22) Filed: Feb. 9, 2021

(65) Prior Publication Data
US 2022/0252434 A1    Aug. 11, 2022

(51) Int. Cl.
| | |
|---|---|
| *G01D 3/08* | (2006.01) |
| *G01D 5/244* | (2006.01) |
| *G01D 5/241* | (2006.01) |
| *B81B 3/00* | (2006.01) |
| *G01L 27/00* | (2006.01) |

(52) U.S. Cl.
CPC ............. *G01D 3/08* (2013.01); *B81B 3/0018* (2013.01); *G01D 5/241* (2013.01); *G01D 5/24466* (2013.01); *G01L 27/007* (2013.01); *B81B 2201/0292* (2013.01)

(58) Field of Classification Search
CPC ...... G01D 3/08; G01D 5/241; G01D 5/24466; G01D 5/24457; B81B 3/0018; B81B 2201/0292; G01L 9/12; G01L 27/007; G01R 31/52; H02H 7/16
See application file for complete search history.

(56) References Cited

U.S. PATENT DOCUMENTS

| | | | | |
|---|---|---|---|---|
| 4,716,487 A | * | 12/1987 | Horvath | ................ G01R 27/18 361/42 |
| 5,708,369 A | | 1/1998 | Horn | |

(Continued)

FOREIGN PATENT DOCUMENTS

| | | |
|---|---|---|
| EP | 1894026 B1 | 5/2017 |
| JP | H05281256 A | 10/1993 |

(Continued)

*Primary Examiner* — Steven L Yeninas
(74) *Attorney, Agent, or Firm* — Harrity & Harrity, LLP

(57) ABSTRACT

A capacitive sensor includes a first conductive structure; a second conductive structure movable relative to the first conductive structure in response to an external force acting thereon, wherein the first and the second conductive structures form a first capacitor having a first capacitance that changes with a change in a distance between the first conductive structure and second conductive structure, wherein the first capacitance is representative of the external force; and a diagnostic circuit configured to detect a first leakage current in the capacitive sensor by measuring an first electrical parameter that is affected by the first leakage current and comparing the measured first electrical parameter to a first predetermined error threshold, wherein the diagnostic circuit is further configured to generate a first error signal in response to the measured first electrical parameter being greater than the first predetermined error threshold.

30 Claims, 8 Drawing Sheets

(56) References Cited

U.S. PATENT DOCUMENTS

| | | | |
|---|---|---|---|
| 7,084,638 B1* | 8/2006 | Kramer | H02H 7/16 |
| | | | 324/76.66 |
| 7,215,127 B1* | 5/2007 | Lu | G01R 31/52 |
| | | | 324/76.66 |
| 9,625,517 B2* | 4/2017 | Zhu | G01R 31/2813 |
| 9,942,677 B2* | 4/2018 | Wiesbauer | H04R 29/004 |
| 2004/0008040 A1 | 1/2004 | Wang | |
| 2006/0273805 A1* | 12/2006 | Peng | G01R 27/2605 |
| | | | 324/686 |
| 2009/0301211 A1* | 12/2009 | Yoshikawa | G01L 27/007 |
| | | | 73/724 |
| 2012/0056867 A1 | 3/2012 | Lier et al. | |
| 2014/0145728 A1* | 5/2014 | Lacombe | G01R 31/52 |
| | | | 324/537 |
| 2015/0233995 A1* | 8/2015 | Pratap | G01R 31/2829 |
| | | | 324/509 |
| 2016/0073212 A1* | 3/2016 | Zeleznik | H01L 21/4828 |
| | | | 324/548 |
| 2016/0231162 A1 | 8/2016 | Schmid et al. | |
| 2017/0099549 A1* | 4/2017 | Wurzinger | H03F 3/183 |
| 2017/0245034 A1* | 8/2017 | Polo | H03F 1/14 |
| 2017/0248649 A1 | 8/2017 | Neel et al. | |
| 2017/0276723 A1* | 9/2017 | Buffa | G01D 5/2403 |
| 2019/0039884 A1* | 2/2019 | Dehe | G01L 9/0041 |
| 2019/0090066 A1* | 3/2019 | Polo | H04R 19/04 |
| 2021/0341548 A1* | 11/2021 | Cencula | G01R 31/52 |

FOREIGN PATENT DOCUMENTS

| | | |
|---|---|---|
| JP | H08159705 A | 6/1996 |
| WO | 2006130828 A2 | 12/2006 |
| WO | 2006134176 A1 | 12/2006 |
| WO | 2008001602 A1 | 1/2008 |

\* cited by examiner

DIAGNOSIS OF ELECTRICAL FAILURES IN CAPACITIVE SENSORS

BACKGROUND

Capacitive sensors have many applications and may be used as pressure sensors, acoustic sensors, microphone sensors, and the like. A capacitive sensor may be a microelectromechanical system (MEMS) capacitive sensor in any of the aforementioned applications.

Leakage is a known failure mode in capacitive sensors. It may occur as inherent leakage of the device itself, drifts of which can be expected during lifetime operation, or, more critically, it may occur as a result of conductive particle contamination.

For example, for a dual backplate capacitive sensor, a known failure mode is a conductive particle between the conductive membrane and any of the two conductive backplates. The conductive particle may cause a short between conductive membrane and any of the two conductive backplates, thus causing leakage current and faulty sensing. the result is a leakage current and/or degradation of sensitivity. The leakage current may also increase noise in the sensor. For dual-die solutions, leakage may also occur if conductive particles are present between the die pads.

Therefore, an improved device capable of detecting and diagnosis electrical failures in capacitive sensors due to conductive particle contamination may be desirable.

SUMMARY

Embodiments provide a capacitive sensor including a first conductive structure; a second conductive structure that is counter to the first conductive structure, wherein at the second conductive structure is movable relative to the first conductive structure in response to an external force acting thereon, wherein the second conductive structure is capacitively coupled to the first conductive structure to form a first capacitor having a first capacitance that changes with a change in a distance between the first conductive structure and second conductive structure, wherein the first capacitance is representative of the external force; and a diagnostic circuit configured to detect a first leakage current in the capacitive sensor by measuring an first electrical parameter that is affected by the first leakage current and comparing the measured first electrical parameter to a first predetermined error threshold, wherein the diagnostic circuit is further configured to generate a first error signal in response to the measured first electrical parameter being greater than the first predetermined error threshold.

Embodiments provide a capacitive sensor including a first conductive structure; a second conductive structure that is counter to the first conductive structure, wherein at the second conductive structure is movable relative to the first conductive structure in response to an external force acting thereon, wherein the second conductive structure is capacitively coupled to the first conductive structure to form a first capacitor having a first capacitance that changes with a change in a distance between the first conductive structure and second conductive structure, wherein the first capacitance is representative of the external force; a third conductive structure that is counter to the first conductive structure, wherein at the third conductive structure is movable relative to the first conductive structure in response to the external force acting thereon, wherein the third conductive structure is capacitively coupled to the first conductive structure to form a second capacitor having a second capacitance that changes with a change in a distance between the first conductive structure and third conductive structure, wherein the second capacitance is representative of the external force; and a diagnostic circuit configured to detect a first leakage current in the first capacitor or a second leakage current in the second capacitor by measuring a first electrical parameter that is affected by the first leakage current and measuring a second electrical parameter that is affected by the second leakage current, respectively.

Embodiments provide a capacitive sensor including: a first conductive structure; a second conductive structure that is counter to the first conductive structure, wherein at the second conductive structure is movable relative to the first conductive structure in response to an external force acting thereon, wherein the second conductive structure is capacitively coupled to the first conductive structure to form a first capacitor having a first capacitance that changes with a change in a distance between the first conductive structure and second conductive structure, wherein the first capacitance is representative of the external force; a third conductive structure that is counter to the first conductive structure, wherein at the third conductive structure is movable relative to the first conductive structure in response to the external force acting thereon, wherein the third conductive structure is capacitively coupled to the first conductive structure to form a second capacitor having a second capacitance that changes with a change in a distance between the first conductive structure and third conductive structure, wherein the second capacitance is representative of the external force; and a diagnostic circuit including a fully differential amplifier coupled to the first capacitor and to the second capacitor, wherein the fully differential amplifier is configured to generate a first signal having a first ripple indicative of a first leakage current of the first capacitor and a second signal having a second ripple indicative of a second leakage current of the second capacitor.

BRIEF DESCRIPTION OF THE DRAWINGS

Embodiments are described herein making reference to the appended drawings.

DETAILED DESCRIPTION

Figure 1:
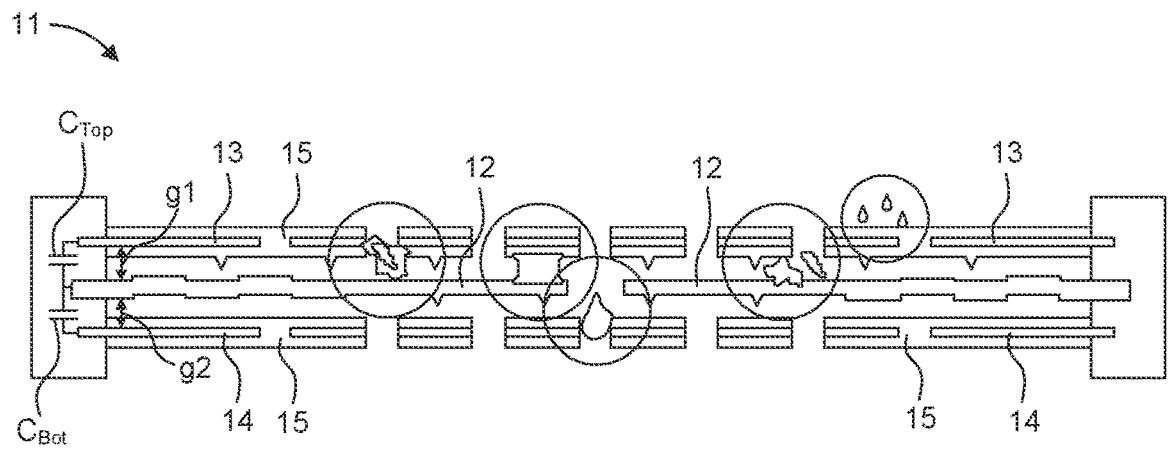
FIG. 1 shows a cross-section view of a MEMS element of a capacitive sensor according to one or more embodiments.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The term "substantially" may be used herein to account for small manufacturing tolerances (e.g., within 5%) that are deemed acceptable in the industry without departing from the aspects of the embodiments described herein.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

One or more aspects of the present disclosure may be implemented as a non-transitory computer-readable recording medium having recorded thereon a program embodying methods/algorithms for instructing the processor to perform the methods/algorithms. Thus, a non-transitory computer-readable recording medium may have electronically readable control signals stored thereon, which cooperate (or are capable of cooperating) with a programmable computer system such that the respective methods/algorithms are performed. The non-transitory computer-readable recording medium can be, for example, a CD-ROM, DVD, Blu-ray disc, a RAM, a ROM, a PROM, an EPROM, an EEPROM, a FLASH memory, or an electronic memory device.

Each of the elements of the present disclosure may be configured by implementing dedicated hardware or a software program on a memory controlling a processor to perform the functions of any of the components or combinations thereof. Any of the components may be implemented as a central processing unit (CPU) or other processor reading and executing a software program from a recording medium such as a hard disk or a semiconductor memory device. For example, instructions may be executed by one or more processors, such as one or more CPUs, digital signal processors (DSPs), general-purpose microprocessors, application-specific integrated circuits (ASICs), field programmable logic arrays (FPGAs), programmable logic controller (PLC), or other equivalent integrated or discrete logic circuitry.

Accordingly, the term "processor," as used herein refers to any of the foregoing structures or any other structure suitable for implementation of the techniques described herein. Thus, the techniques described in this disclosure may be implemented, at least in part, in hardware, software, firmware, or any combination thereof. For example, various aspects of the described techniques may be implemented within one or more processors, including one or more microprocessors, DSPs, ASICs, or any other equivalent integrated or discrete logic circuitry, as well as any combinations of such components.

A controller including hardware may also perform one or more of the techniques of this disclosure. A controller, including one or more processors, may use electrical signals and digital algorithms to perform its receptive, analytic, and control functions, which may further include corrective functions. Such hardware, software, and firmware may be implemented within the same device or within separate devices to support the various techniques described in this disclosure. Software may be stored on a non-transitory computer-readable medium such that the non-transitory computer readable medium includes a program code or a program algorithm stored thereon which, when executed, causes the controller, via a computer program, to perform the steps of a method.

A signal processing circuit and/or a signal conditioning circuit may receive one or more signals from one or more components and perform signal conditioning or processing thereon. Signal conditioning, as used herein, refers to manipulating a signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a signal suitable for processing after conditioning.

Thus, a signal processing circuit may include an analog-to-digital converter (ADC) that converts the analog signal from the one or more sensor elements to a digital signal. The signal processing circuit may also include a digital signal processor (DSP) that performs some processing on the digital signal.

Embodiments are directed to the diagnosis of electrical failures in capacitive sensors, and more precisely the diagnosis of leakage currents in micro-electromechanical system (MEMS) capacitive sensors, one of the critical failure modes of this device. The diagnosis may be applied any capacitive sensor, including single capacitive sensors or those that use two capacitors (e.g., a top capacitor $C_{Top}$ and a bottom capacitor $C_{Bot}$) for sensing and generating measurements signals representative of the physical quantity (e.g., pressure, acoustic waves, vibrations, or any other alternating current (AC) external force) being measured by the capacitive sensor.

The diagnostic circuit performs its diagnosis by measuring some selected electrical parameter of the MEMS capacitive sensor, such as a direct current (DC) voltage or a voltage ripple (e.g., a root mean square (RMS) value thereof), and then supplies this information as an output diagnosis after some pre-processing. Depending on the read-out solution used (e.g., constant voltage, constant charge, discrete-time charge sensing, etc.), a leakage current, if present, will result either in a DC voltage shift or either in a voltage ripple (for a chopped system) at the output of the MEMS capacitive sensor or at an output of a sense amplifier that exceeds a tolerance range or threshold. The diagnostic circuit is configured to measure one of these electrical parameters, and, once they cross a certain, predetermined threshold to supply this information as an output diagnosis (e.g., as a leakage current indicator).

In one or more embodiments, the diagnostic circuit further performs compensation for a detected conductive particle contamination by controlling of the bias system of the MEMS capacitive sensor so that the effect of the leakage current upon the performance is substantially reduced at the cost of a decrease in signal-to-noise ratio (SNR). Such a compensation is capable of restoring some performance of the MEMS capacitive sensor.

FIG. 1 shows cross-section views of a MEMS element of a capacitive sensor according to one or more embodiments. In particular, FIG. 1 shows a MEMS element 11 of a dual backplate capacitive sensor that may be implemented as a MEMS microphone, but the embodiments are not limited thereto. For example, MEMS capacitive sensors may also be used as pressure sensors.

The MEMS element 11 of the dual backplate capacitive sensor includes three electrodes, including one conductive membrane 12 and two conductive back-plates 13 and 14. The membrane 12 is movable and the two conductive back-plates 13 and 14 may be movably fixed in a stationary position. In other embodiments, one or more of the back-plates 13 and 14 may also be movable.

A top capacitor CTop is formed between the top back-plate 13 and the membrane 12 and a bottom capacitor CBot is formed between the bottom back-plate 14 and the membrane 12. As the distance (i.e., thickness of gap g1 or g2) between respective electrodes changes in response to an external force (e.g., pressure or acoustic waves (sound)) applied to the movable conductive structure (e.g., the membrane 12), the capacitance of each capacitor CTop and CBot changes. For example, capacitance is calculated according to the formula Q=CV, where Q is the charge in coulombs, C is the capacitance in farads, and V is the potential difference between the electrodes of the capacitor in volts.

Different types of read-out circuits may be used to measure the change in capacitance. For example, a read-out circuit may utilize constant change readout during which the voltage V is measured while the charge Q is held constant. The change in capacitance caused by the thickness of gaps g1 and g2 changing causes the voltages Vtop and Vbot stored across the capacitors to change, and a measurement circuit may measure these voltages as sensor signals. Specifically, the voltage across each capacitor CTop and CBot represents a sensor signal that can be measured by a readout circuit and correlated into a physical quantity such as pressure or acoustic waves (sound). Thus, the voltage is the variable to be measured. Alternatively, a read-out circuit may utilize constant voltage readout during which the charge Q is measured while the voltage V is held constant. In such a case, the charge Q is the measured parameter that changes as the thickness of gaps g1 and g2 changes.

In the present example, the membrane 12 may move closer to one back-plate as it moves further from the other back-plate, thereby changing the capacitance of each capacitor CTop and CBot. The movement of the membrane 12 is cause by an external force (e.g., pressure or acoustic waves (sound), or vibration) applied to the membrane 12. These external forces are oscillating or AC external forces that that changes in polarity or direction over time.

It will also be appreciated that the embodiments are not limited to dual backplate capacitive sensors but may also apply to single capacitor sensors consisting of two electrodes or capacitive sensors with two or more capacitors, including dual capacitive sensors where the two outside electrodes are movable and the middle electrode is movably fixed. Regardless of the type of capacitive sensor, at least two electrodes are used to form at least one capacitor. Each capacitor is thereby formed by two electrodes, at least one of which is moveable relative to the other in response to an external force being applied thereto. One electrode of a capacitor may be referred to as a reference electrode, whereas the other electrode of a capacitor may be referred to as a counter electrode.

An isolation material 15 is also provided to provide electrical isolation between the conductive elements 12, 13, and 14.

Conductive materials such as metal particles or water droplets may penetrate the MEMS element 11 and form a conductive path (e.g., a short) between otherwise electrically isolated portions of the MEMS element 11. An unwanted leakage current may form as a result that negatively impacts the performance of the MEMS element 11. Leakage current may also be caused by internal defects within the integrated circuit itself that may develop over the lifetime of the device. The following embodiments provide additional readout circuitry used to detect a leakage current and possibly compensate for the leakage current to restore or otherwise improve the functionality of the capacitive sensor.

Figure 2:
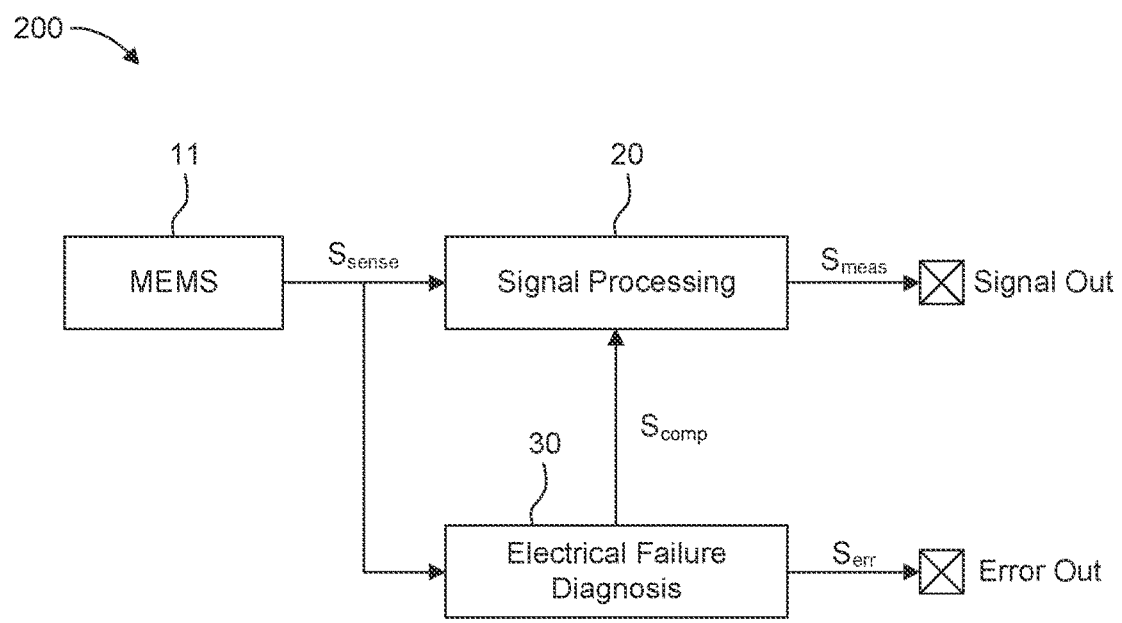
FIG. 2 is a block diagram of a capacitive sensor according to one or more embodiments.

FIG. 2 is a block diagram of a capacitive sensor 200 according to one or more embodiments. The capacitive sensor 200 includes a MEMS element (e.g., MEMS element 1 or 11) and a signal processing circuit 20 that is configured to receive sensor signals Ssense (e.g., voltages Vtop and Vbot) from the MEMS element 11, perform signal processing thereon, and output the processed sensor signals as measurement signals Smeas at Signal Out. A readout circuit is provided between the MEMS element 11 and the signal processing circuit 20. The readout circuit receives signals from the MEMS element 11 and may include a biasing circuit (e.g., a resistive biasing circuit) for providing signals to the signal processing circuit 20. The readout circuit is shown in FIGS. 3A-3E, 4, and 5. The capacitive sensor 200 also includes an electrical failure diagnosis circuit 30 that is configured to receive the sensor signals Ssense and detect a leakage current based thereon. In response to detecting an electrical failure, such as a leakage current, the electrical failure diagnosis circuit 30 is configured to generate an error signal Serr and output the error signal Serr at Error Out.

In order to detect an electrical failure, the electrical failure diagnosis circuit 30 is configured to measure one of the electrical parameters affected by MEMS leakage current, compare the electrical parameter to a predetermined error threshold, and generate the error signal Serr in response to the electrical parameter crossing (e.g., exceeding) the predetermined error threshold. An electrical parameter affected by the MEMS leakage current may include a DC voltage or a voltage ripple. In particular, a leakage current, if present, will result either in a DC voltage shift or in a voltage ripple (for a chopped system) at the output of the MEMS element 11 or at an output of a sense amplifier. The electrical failure diagnosis circuit 30 may be configured to monitor for and detect the DC voltage shift that exceeds a predetermined error threshold or a voltage ripple (e.g., an RMS value thereof) that exceeds a predetermined error threshold.

The error signal Serr may be provided to a further diagnostic circuit (not illustrated) configured to perform further analysis on the capacitive sensor 200 to determine the cause or the source of the electrical failure. The electrical failure diagnosis circuit 30 may also be configured to compensate for the detected leakage current by regulating the affected electrical parameter and restore reasonable performance. The electrical failure diagnosis circuit 30 is configured to generate and transmit a compensation signal Scomp to the signal processing circuit 20 or to a readout circuit where the compensation information provided in the compensation signal Scomp is used to compensate for the affected electrical parameter.

Figure 3A:
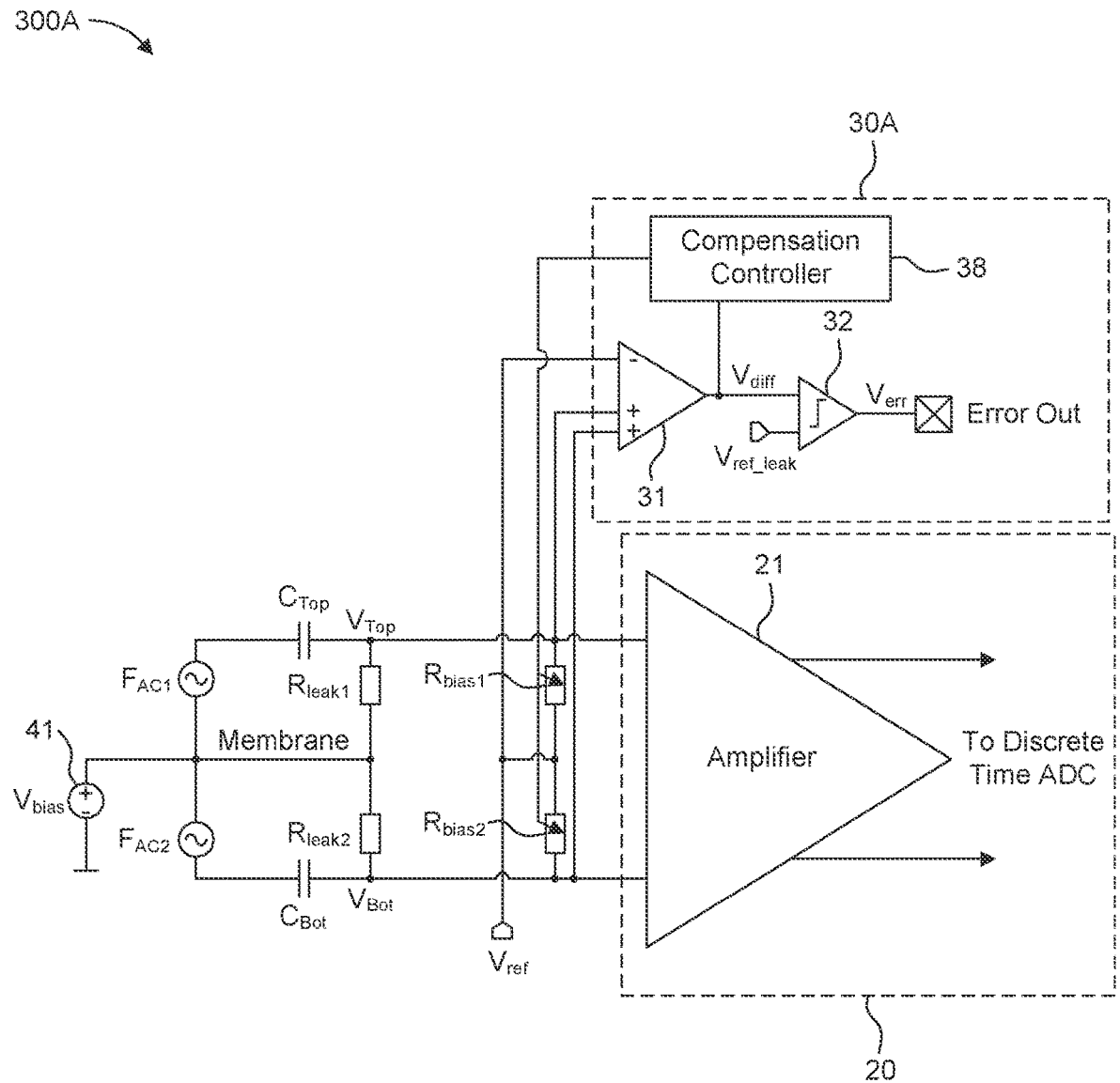
FIGS. 3A-3E are schematic block diagrams of capacitive sensor read-out circuits according to one or more embodiments.
Figure 3B:
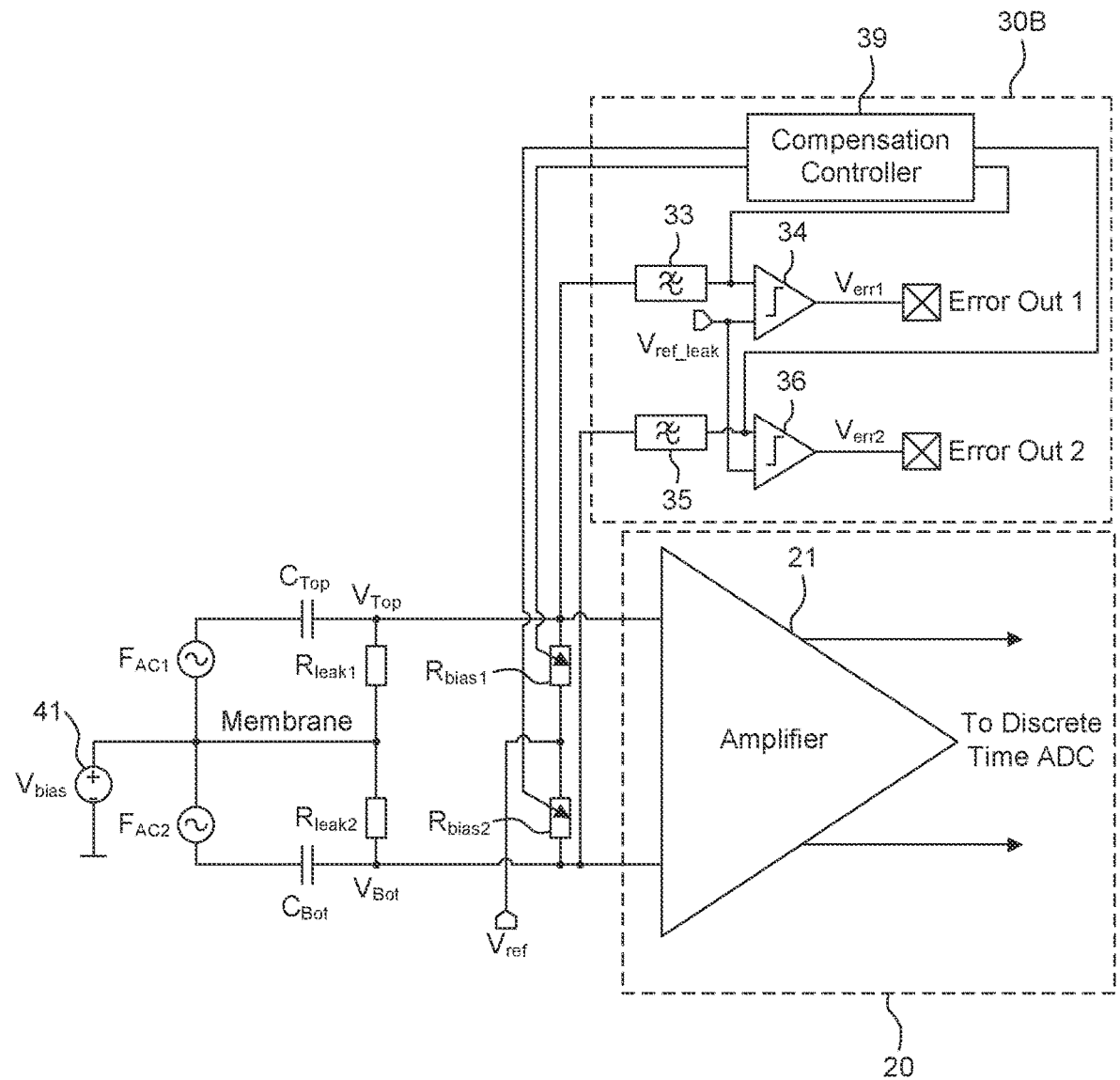

FIGS. 3A and 3B are schematic block diagrams of capacitive sensor read-out circuits according to one or more embodiments. In particular, FIG. 3A shows a capacitive sensor read-out circuit 300A comprising one type of electrical failure diagnosis circuit 30A and FIG. 3B shows a capacitive sensor read-out circuit 300B comprising another type of electrical failure diagnosis circuit 30B. With the exception of the diagnosis circuits 30A and 30B having different configurations, the read-out circuits 300A and 300B are substantially the same. Both read-out circuits 300A and 300B are constant charge (CC) read-out circuits for reading out signals of a capacitive MEMS element (e.g., MEMS element 11). Thus, the charge of each capacitor CTop and CBot is held constant while the voltage across the capacitors is varied based on the change in capacitance.

A DC bias voltage supply 41 supplies a DC bias voltage Vbias to the conductive structures (i.e., the back-plate(s) and membrane(s)) of the MEMS element. AC external forces $F_{AC1}$ and $F_{AC2}$ are representative of forces being applied and acting on the conductive structures, thereby causing a change in capacitance at capacitors CTop and/or CBot.

An amplifier 21, such as a programmable-gain amplifier or a buffer amplifier, is configured to receive the voltages Vtop and Vbot from the MEMS element as sensor signals. The amplifier 21 is part of the signal processing circuit 20 and may be the beginning of a signal processing chain thereof. For example, the amplifier 21 may be configured to receive the sensor signals (i.e., voltages Vtop and Vbot) and provide amplified sensor signals to a discrete time ADC (not illustrated) that is arranged downstream along the signal processing chain of the signal processing circuit 20.

In both read-out circuits 300A and 300B, leakage current can be modelled either as a leakage resistor Rleak or a current source that is coupled in parallel to the MEMS equivalent capacitance CTop or CBot, respectively. There may be a leakage between the top two conductive structures of the MEMS element 11 (e.g., conductive structures 2 and 3 or 12 and 13) or between the bottom two conductive structures of the MEMS element 11 (e.g., conductive structures 2 and 4 or 12 and 14). Thus, there may be a leakage resistor modelled for each leakage current as indicated by leakage resistor Rleak1 and leakage resistor Rleak2. However, the leakage resistors Rleak1 and Rleak2 may generally be referred to as "Rleak" when describing leakage current in general.

The voltages Vtop and Vbot at the MEMS element output is set via a very high-ohmic bias resistor Rbias1 and Rbias2, respectively, and a reference voltage Vref. The bias resistors Rbias 1 and Rbias2 are set at a very high-ohmic value to reduce noise present at the inputs of the amplifier 21. For example, the bias resistors Rbias1 and Rbias2 may be initially set anywhere between 1 Gohm and 500 Gohms depending on the noise suppression requirements and bandwidth requirements of the readout circuit. The higher the resistance, the higher the noise suppression that provides higher SNR. However, it is conceivable that other resistances could be used. In this example, bias resistors Rbias1 and Rbias2 are maintained to be equal or substantially equal and may be adjustable in order to compensate for a detected leakage current.

When there is no leakage current, Rleak may be considered very high or infinite. At the very least, Rleak is considered to be greater than Rbias. When a leakage current is present, Rleak decreases towards Rbias. The failure mode is related to the ratio of Rbias/Rleak. When Rleak is close to Rbias, corresponding to a certain predetermined threshold, the failure mode appears and the leakage current or a defect resulting in the leakage current can be detected and, in some cases, compensated.

Accordingly, as long as the equivalent leakage resistor Rleak is significantly more than the bias resistors Rbias1 and Rbias 2, then the Vtop and Vbot DC voltages at the MEMS output are set only by the reference voltage Vref, after a charging time given by Rbias and the time constants of Ctop and Cbot. However, if leakage current is present on, e.g. Vtop (i.e., the leakage current increases), the value of the equivalent leakage resistor Rleak decreases. At this moment, the DC voltage at the Vtop MEMS output can be seen as the output of a resistive divider between resistors Rleak and Rbias1. The same applies to Vbot if the leakage appears on this side. If a leakage current is present on, e.g., Vbot, the DC voltage at the Vbot MEMS output can be seen as the output of a resistive divider between resistors Rleak and Rbias2.

In FIG. 3A, this DC voltage can be sensed via a common mode amplifier 31 or common mode buffer. The common mode amplifier 31 includes two input terminals that are electrically connected to DC voltages Vtop and Vbot, respectively. The common mode amplifier 31 is configured to generate an averaged signal internally that represents the average of these two inputs (i.e., the average of voltages Vtop and Vbot). The common mode amplifier 31 also includes an input terminal electrically connected to the common mode voltage Vcm. The common mode amplifier 31 is configured to generate a differential output signal Vdiff that represents the difference between the averaged signal and the common mode signal (i.e., the common mode voltage Vcm).

The diagnosis circuit 30A also includes a threshold comparator 32 that receives the output signal Vdiff from the common mode amplifier 31 at one of its inputs, receives a predetermined error threshold voltage Vref_leak at its other input, and generates an error signal Verr in response to the output signal Vdiff being greater than the predetermined error threshold voltage Vref_leak.

The diagnosis circuit 30A may also include a compensation controller 38 that is configured to receive the output signal Vdiff and adjust the resistive values of the bias resistors Rbias1 and Rbias2 based on the value of the output signal Vdiff. If the DC voltage Vtop or Vbot increases, leakage current is assumed, and the bias resistors Rbias can be reduced at the expense of decreased SNR. The compensation controller 38 may adjust the resistance of the bias resistors Rbias1 and Rbias2, either in the digital domain or the analog domain, using a sliding scale based on the value of output signal Vdiff. For example, as the output signal Vdiff increases, the resistance of the bias resistors Rbias1 and Rbias2 may be decreased. Thus, compensation controller 38 may apply different resistance settings to the bias resistors Rbias1 and Rbias2 based on the output signal Vdiff in order to compensate for the magnitude of the leakage current (i.e., the magnitude of Rleak). For example, the bias resistors Rbias1 and Rbias2 may be adjusted to be maintained to be less than Rleak, and more particularly to be less than Rleak by a predetermined amount. In other words, as long as Rleak is much greater than Rbias1 and Rbias 2 (i.e., by a predetermined amount), proper operation is ensured. As noted above, Rbias1 and Rbias 2 are maintained to be equal or substantially equal.

While the leakage current is still present despite the compensation, its impact is mitigated. In particular, when the output signal Vdiff indicates that a leakage current is present, the compensation controller 38 is configured to decrease the resistance of the bias resistors Rbias1 and Rbias2. Accordingly, the ratio Rbias/Rleak is brought back to an acceptable level. While this decreases the SNR, the adjustment made to the bias resistors Rbias1 increases the ratio between resistors Rleak and Rbias1, thereby shifting the DC voltages (Vtop and Vbot) back into an acceptable range.

In FIG. 3B, the diagnosis circuit 30B includes two diagnostic branches, one for monitoring a respective DC voltage Vtop or Vbot. The first diagnostic branch is configured to monitor DC voltage Vtop and includes a low-pass filter (LPF) 33 and a threshold comparator 34. The LPF 33 receives the DC voltage Vtop, filters the sensor signal (for the diagnosis mode the useful signal is a nuisance and can be seen as parasitic), and provides the filtered Vtop signal to the threshold comparator 34. The threshold comparator 34 compares the filtered Vtop signal to a predetermined error threshold voltage Vref_leak and generates an error signal Verr1 in response to the filtered Vtop signal being greater than the predetermined error threshold voltage Vref_leak. Thus, once the DC voltage passes a certain threshold it means that significant leakage current was detected and this information can be communicated from the capacitive sensor readout circuit 300B to another device in the system.

The second diagnostic branch is configured to monitor DC voltage Vbot and includes an LPF 35 and a threshold comparator 36. The LPF 35 receives the DC voltage Vbot, filters the sensor signal, and provides the filtered Vbot signal to the threshold comparator 36. The threshold comparator 36 compares the filtered Vbot signal to the predetermined error threshold voltage Vref_leak and generates an error signal Verr2 in response to the filtered Vbot signal being greater than the predetermined error threshold voltage Vref_leak. Thus, once the DC voltage passes a certain threshold it means that significant leakage current was detected and this information can be communicated from the capacitive sensor 300B to another device in the system. Two error signals may provide an advantage in determining a location of the source of the leakage current.

The diagnosis circuit 30B may also include a compensation controller 39 that is configured to receive the filtered Vtop signal from LPF 33 and the filtered Vbot signal from LPF 35 and adjust the resistive values of the bias resistors Rbias1 and Rbias2 based on their respective values. In this case, Rbias1 and Rbias 2 can be independently controlled since the diagnostic circuit 30B evaluates the DC voltages Vtop and Vbot separately. In particular, when either the filtered Vtop signal or the filtered Vbot signal indicates that a leakage current is present, the compensation controller 39 is configured to decrease the resistance of the corresponding bias resistor Rbias1 or Rbias2. The compensation controller 39 may adjust the resistance of the bias resistors Rbias1 and Rbias2, either in the digital domain or the analog domain, using a sliding scale based on the value of the output of LPF 33 or the output of LFP 34, respectively. As the values of the LPFs increase, the bias resistances are decreased accordingly so that Rleak is greater than Rbias1 and Rbias 2 (e.g., by a predetermined amount). While this decreases the SNR, the adjustment made to the bias resistors Rbias1 and/or Rbias2 increase the difference between the leakage resistor Rleak and the bias resistors, thereby shifting the DC voltages (Vtop and Vbot) back into an acceptable range.

Figure 3C:
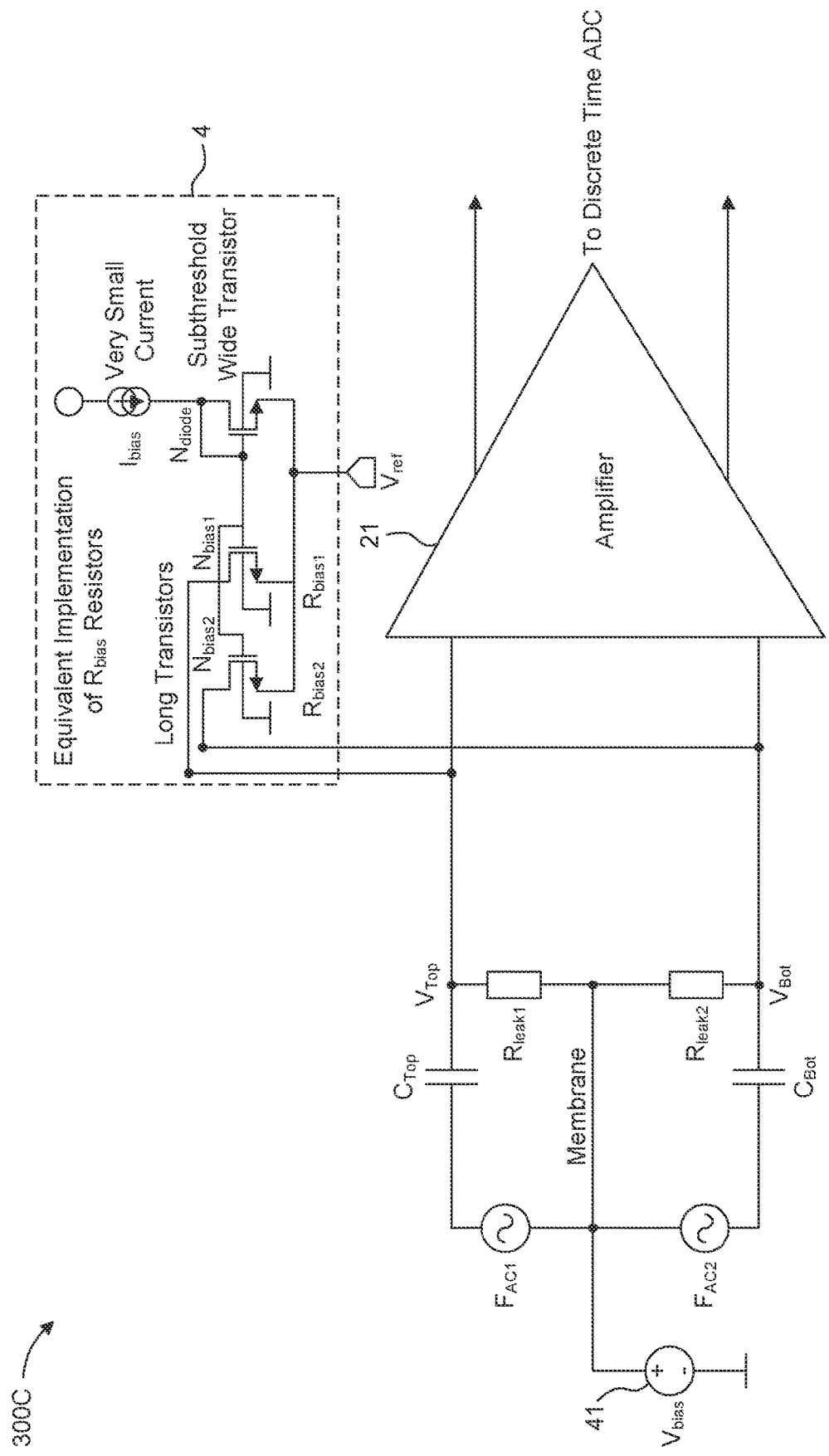

FIG. 3C is schematic block diagrams of capacitive sensor read-out circuit according to one or more embodiments. In particular, the capacitive sensor read-out circuit 300C is similar to capacitive sensor read-out circuits 300A and 300B, with the exception that active devices (e.g., NMOS transistors) are used to mimic the bias resistors Rbias1 and Rbias2. Accordingly, a resistive bias circuit 4 is provide that is an equivalent implementation of the bias resistors Rbias1 and Rbias2.

In order to implement Rbias1 and Rbias2 resistors, two NMOS long devices (Nbias1 and Nbias2) are used with long length L (width/length W/L geometrical factor) biased in terms of gate-to-source voltage Vgs with a very small voltage coming from a diode Ndiode. The diode Ndiode has large W/L geometrical factor (subthreshold wide transistor) and it is biased by a very low current source Ibias in order produce the low Vgs voltages needed for transistors Nbias1 and Nbias2. In order to increase the output equivalent resistances of Nbias1 and Nbias2, the bulk of these devices is connected to ground GND (body effect). The equivalent resistance of Nbias1 is Rbias1 and the equivalent resistance of Nbias2 is Rbias2.

Figure 3D:
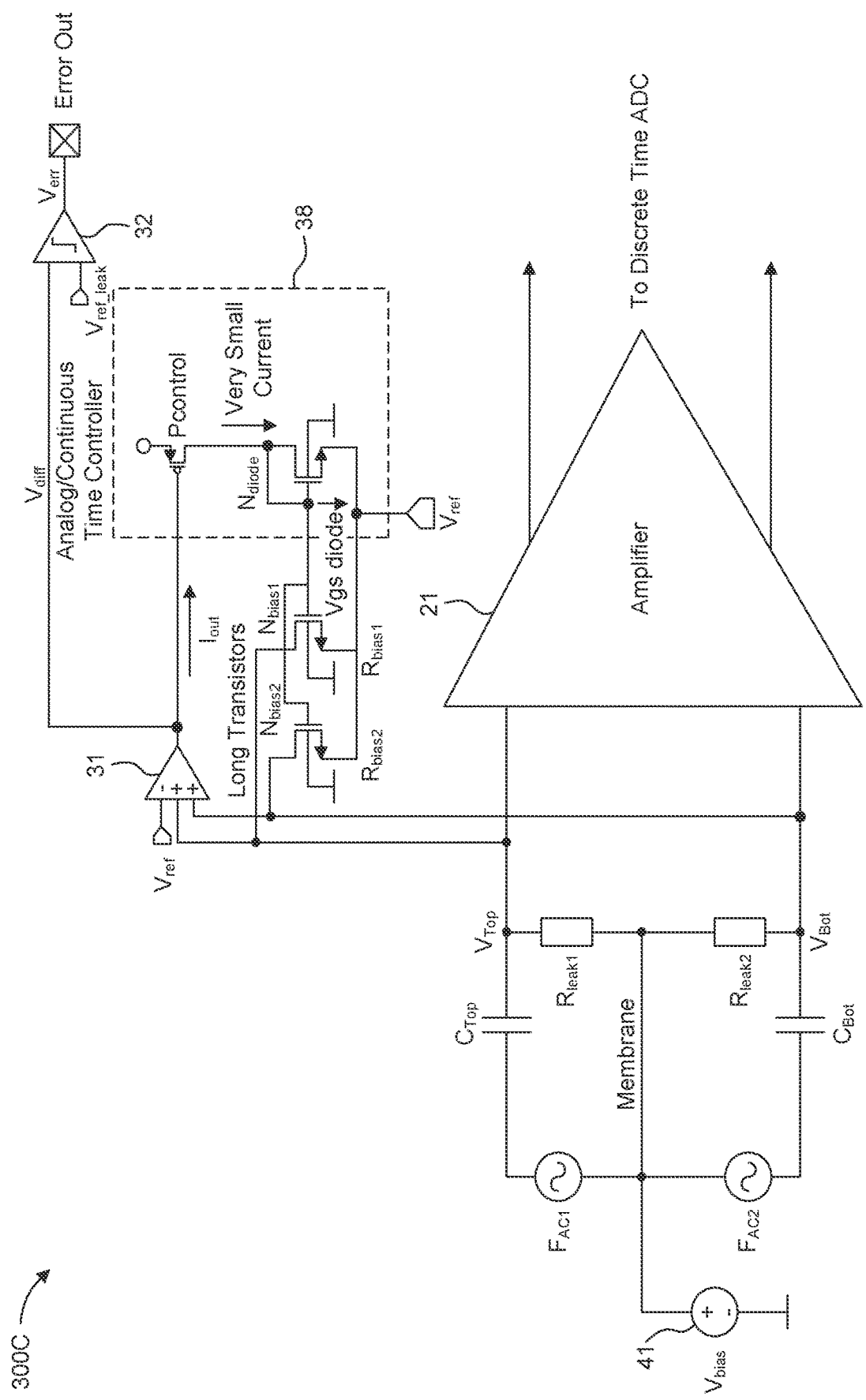

FIG. 3D is schematic block diagrams of capacitive sensor read-out circuit 300C that further includes a compensation controller 38 according to one or more embodiments. The compensation controller 38 is an analog, continuous time controller that adjusts the equivalent resistances Rbias1 of Nbias1 and the equivalent resistance Rbias2 of Nbias2 based on the differential output voltage Vdiff or output current Iout corresponding thereto generated by the common mode amplifier 31. As the differential output voltage Vdiff increases (or output current Iout increases), the equivalent resistances Rbias1 and Rbias2 of the transistors Nbias1 and Nbias2 decreases. A PMOS transistor Pcontrol is configured as the bias current source Ibias and is controlled by the differential output voltage Vdiff (or output current Iout). The bias current Ibias that is allowed to flow through the control transistor Pcontrol provides a real-time, analog adjustment to the equivalent resistances Rbias1 and Rbias2 of the transistors Nbias1 and Nbias2.

Specifically, the common mode amplifier 31 amplifies the difference between the averaged non-inverting inputs (outputs of the MEMS element 11, Vtop and Vbot) and the inverting input (common mode reference Vref). In this way, the common mode amplifier 31 senses the difference between the averaged noninverting inputs and inverting input. The output current Iout of the common mode amplifier 31 is injected into the gate of the control transistor Pcontrol. The voltage drop on Pcontrol is proportional with the output current Iout (MOS transistor square law). The output current Iout into Pcontrol and then into the Ndiode devices. The control transistor Pcontrol and the diode Ndiode form the continuous time controller 38 of the leakage compensation loop. The output of the continuous time controller 38 (Vgs diode of Ndiode) is applied to the gates of long-devices Nbias1 and Nbias2 controlling this way the equivalent resistances from Vref to Vtop and Vbot (i.e., the DC outputs of MEMS 11). According, the continuous time controller 38 can continuously compensate the common mode leakage current Rleak.

Figure 3E:
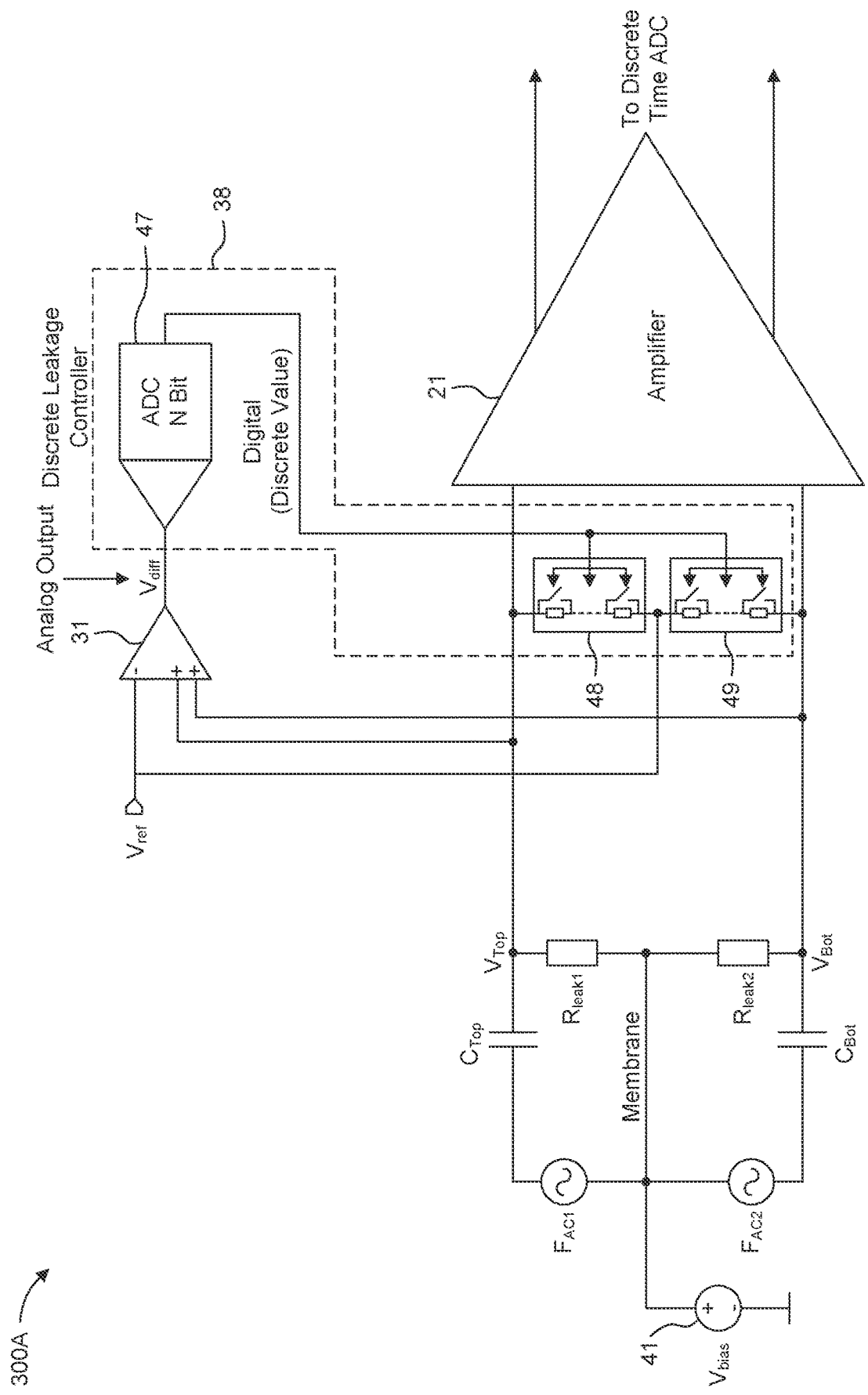

FIG. 3E is schematic block diagrams of capacitive sensor read-out circuit 300A that further includes a compensation controller 38 according to one or more embodiments. The compensation controller 38 is digital, discrete time controller. In this implementation, the output of the common mode amplifier 31 is chained with an N-bit analog-to-digital converter (ADC N bit) 47 followed by two N bit digital-to-analog converters (DACs) 48 and 49 that are each made up of a switched series resistor network whose switches are controlled based on the N-bit value output by the N-bit ADC 47. N represents an integer greater than zero and is a number of bits the N-bit ADC converter 47 outputs as a digital bit or as a digital word.

Switches in each of the N-bit DACs 48 and 49 are coupled in parallel to a respective resistor in the switched series resistor network. Each N-bit digital-to-analog converter 48 and 49 includes N resistors switchably coupled in series.

Closing a switch effectively removes the respective resistor from the chain (i.e., the signal path) as the signal path would circumvent the resistor and follow though the switch, thereby decreasing the resistance of the switched series resistor network (i.e., thereby decreasing Rbias). Opening a switch effectively couples the respective resistor into the series signal path, thereby increasing the resistance of the switched series resistor network (i.e., thereby increasing Rbias). The N-bit DAC 48 is coupled between nodes Vtop and Vref and provides an equivalent resistance of Rbias1 which is adjusted by coupling or decoupling its resistors in the signal path between the nodes Vtop and Vref. Similarly, N-bit DAC 49 is coupled between nodes Vref and Vbot and provides an equivalent resistance of Rbias2 which is adjusted by coupling or decoupling its resistors in the signal path between the nodes Vref and Vbot. The bias resistances Rbias1 and Rbias2 are maintained equal or substantially equal.

Accordingly, the output Vdiff of the common mode amplifier 31 is an analog voltage showing the magnitude of the change of leakage/bias resistance needed to stabilize the loop. The output the common mode amplifier 31 is placed at the input of the N-bit ADC 47, which converts the analog value into a corresponding N-bit value. The output of the N-bit ADC 47 is then coupled to the inputs of the N-bit DACs 48 and 49. The ADC output coding of Vdiff can be diverse (binary, thermometric/unary, etc.). The coding at the output of the ADC needs to fit the DAC decoding in order to have a monotonic behavior from the output of the common mode amplifier 31 to the bias resistor value (Rbias1 or Rbias2 DAC outputs). Thus, the compensation controller 38 is configured to adjust the bias resistance Rbias1 and Rbias2 based on the differential output voltage output Vdiff of the common mode amplifier 31. As the leakage current increases, Vdiff increases, and the bias resistor values Rbias1 and Rbias2 are decreased according to the ADC output coding.

According to FIGS. 3A-3E, different current impeding circuits are provided in a resistive bias circuit with equivalent resistances (Rbias1 and Rbias2) that are adjustable inversely to a measured electrical parameter that is affected by leakage current. In this way, the current impeding circuits of the resistive bias circuit can be used to compensate for the detected leakage current while providing biasing that helps to improve SNR.

Figure 4:
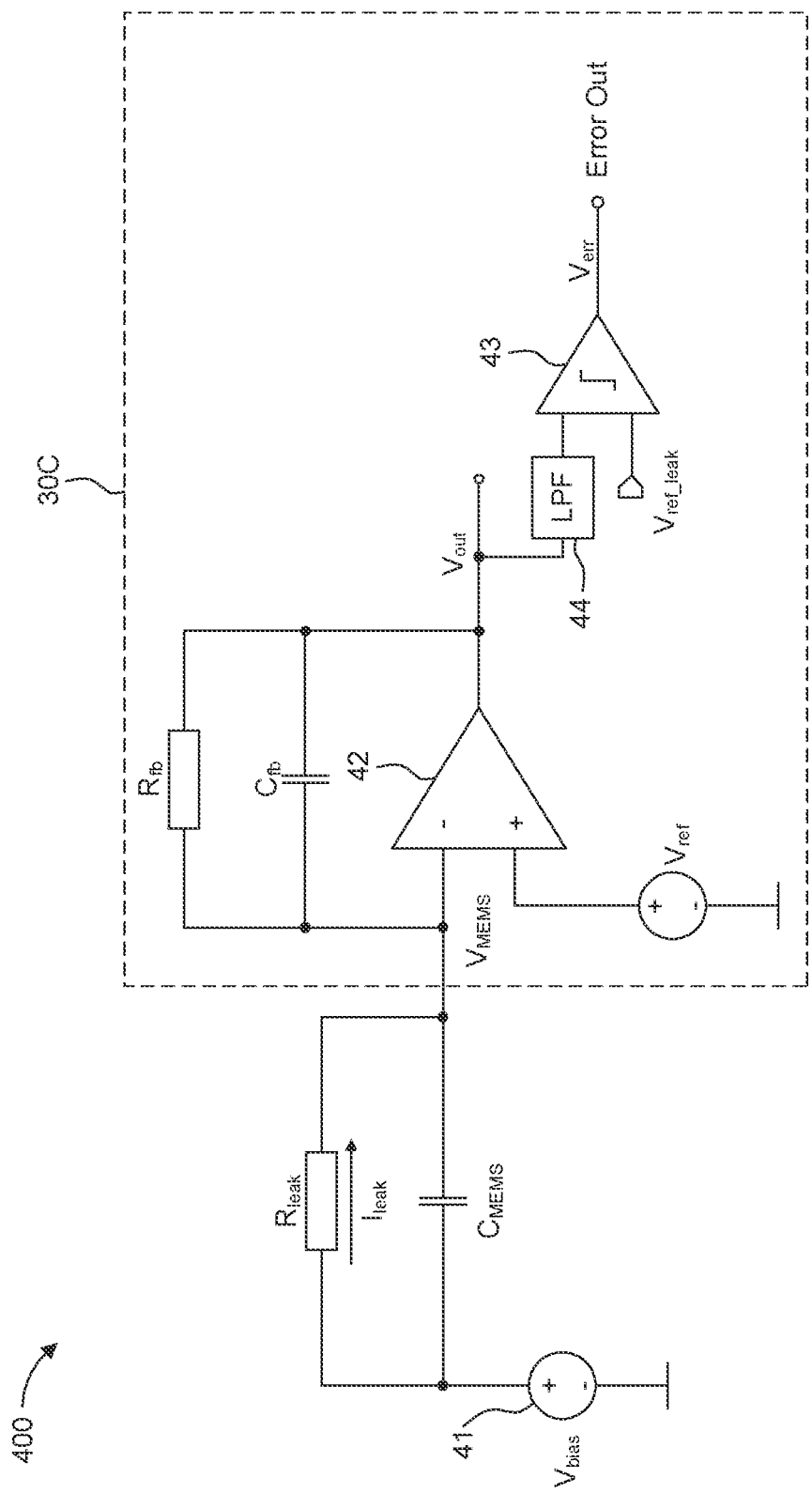
FIG. 4 is schematic block diagram of another capacitive sensor read-out circuit according to one or more embodiments.

FIG. 4 is schematic block diagram of a capacitive sensor read-out circuit 400 according to one or more embodiments. In particular, the capacitive sensor read-out circuit 400 is a constant voltage (CV) read-out circuit for reading out signals of a capacitive MEMS element (e.g., MEMS element 11). Here, a capacitor CMEMS is representative of either the top MEMS capacitor CTop or the bottom MEMS capacitor CBot. Similarly, a DC voltage at the MEMS output is shown as VMEMS, which is representative of either DC voltage Vtop or Vbot. Accordingly, two capacitive sensor read-out circuits 400 may be used to read out each of the top MEMS capacitor CTop and the bottom MEMS capacitor CBot from MEMS element 11.

Leakage current can be modelled either as a leakage resistor Rleak or as a current source coupled in parallel to the MEMS equivalent capacitance CMEMS. For CV read-out, the DC voltage VMEMS at the MEMS output is set to Vref via the negative feedback loop of the amplifier 42. The DC Vout voltage is set via feedback resistor Rfb and a reference voltage Vref that is supplied to the non-inverting input of an amplifier 42 (e.g., a buffer). Vout can be written as VMEMS+I*Rfb. If the leakage resistor Rleak is considered infinite, then Ileak=0, and Vout is equal to VMEMS. Here, by using a feedback capacitor Cfb in the negative feedback path, the amplifier 42 is implemented as a trans-capacitive amplifier. If the useful signal is modeled as an AC voltage source in series with CMEMS, and the VMEMS voltage is fixed by the negative feedback loop (constant voltage approach), the generated charge will flow into feedback capacitor Cfb and then Vout will represent an inverted and amplified replica of the initial AC voltage.

Based on the model, the resistive value of Rleak decreases as leakage current increases. The effect of the leakage current will be that the DC voltage of the output voltage Vout of the amplifier 42 will change (i.e., shift) compared to the reference voltage Vref. This DC voltage Vout can be sensed via a low-pass filter 44 and a threshold comparator 43 provide in an electrical failure diagnosis circuit 30C. The threshold comparator 43 that receives the DC voltage Vout from the amplifier 42 at one of its inputs, receives a predetermined error threshold voltage Vref_leak at its other input, and generates an error signal Verr in response to the DC voltage Vout being greater than the predetermined error threshold voltage Vref_leak. Once the DC voltage Vout passes a certain threshold it means that significant leakage was detected and this information can be communicated from the capacitive sensor 400 to the system.

Figure 5:
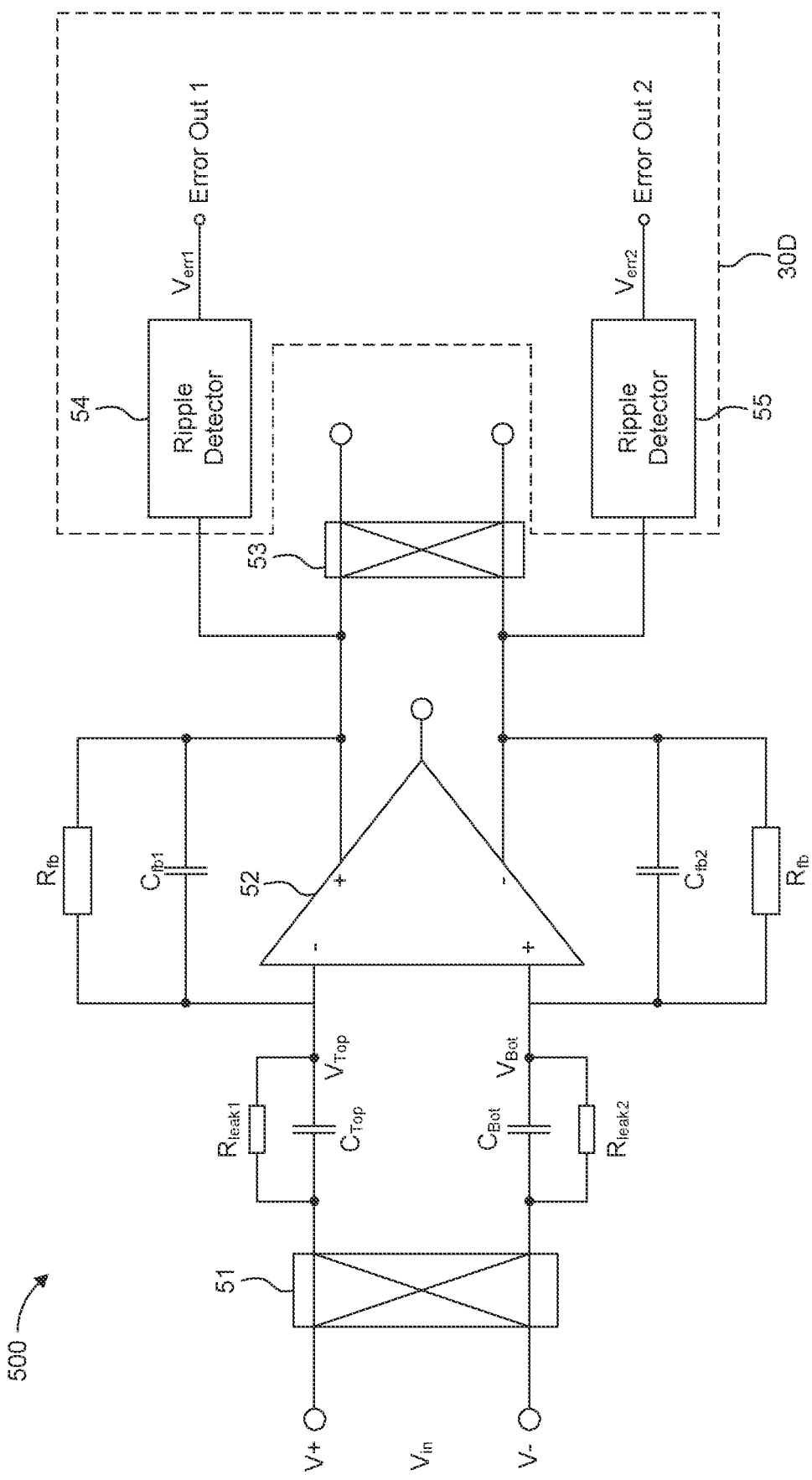
FIG. 5 is schematic block diagram of another capacitive sensor read-out circuit according to one or more embodiments.

FIG. 5 is schematic block diagram of a capacitive sensor read-out circuit 500 according to one or more embodiments. In particular, the capacitive sensor read-out circuit 500 is a constant voltage (CV) read-out circuit for reading out signals of a capacitive MEMS element (e.g., MEMS elements 11).

The input voltage Vin first passes through a chopper circuit 51 which derived by clock at frequency fch, so this signal is modulated at fch. Next, the modulated signal is amplified by the fully differential amplifier 52. The second chopper circuit 53 demodulates the amplified input signal back to DC. This results in an amplified input signal without an offset.

This time a very large feedback resistor Rfb is used to increase the SNR, so chopping is needed to avoid saturation of the fully differential amplifier 52. The leakage current from V+ is integrated into Cfb1 on one of the chopping phases, and the inverse of this leakage current from V− is integrated into Cfb2 on the other of the chopping phases. This creates a triangular signal at the output of the fully differential amplifier 52. This triangular signal can be seen as a ripple proportional to the leakage current.

An electrical failure diagnosis circuit 30D includes ripple detectors 54 and 55 configured to detect when significant leakage current is present at the top portion of the MEMS element 11 or at the bottom portion of the MEMS element 11, respectively. The fully differential amplifier 52 may also be considered as part of the readout circuit and/or the electrical failure diagnosis circuit 30D, along with its feedback paths. For example, each ripple detector 54 and 55 measures the RMS value of the voltage signal supplied to an input terminal thereof, compares the measured RMS value to a predetermined RMS threshold, and generates an error signal Verr1 or Verr2 in response to the measured frequency being greater than the predetermined threshold frequency. Once one of the measured ripple frequencies passes a certain threshold it means that significant leakage was detected at a corresponding portion of the MEMS element 11 and this information can be communicated from the capacitive sensor 500 to the system.

While various embodiments have been described, it will be apparent to those of ordinary skill in the art that many more embodiments and implementations are possible within the scope of the disclosure. Accordingly, the invention is not to be restricted except in light of the attached claims and their equivalents.

With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

In summary, although various exemplary embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized, and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

What is claimed is:

1. A capacitive sensor, comprising:
   a first conductive structure;
   a second conductive structure that is counter to the first conductive structure,
      wherein at the second conductive structure is movable relative to the first conductive structure in response to an external force acting thereon,
      wherein the second conductive structure is capacitively coupled to the first conductive structure to form a first capacitor having a first capacitance that changes with a change in a distance between the first conductive structure and second conductive structure,
      wherein the first capacitance is representative of the external force, and
      wherein the first capacitor is coupled to a first direct current (DC) voltage set by a bias resistive circuit;
   a third conductive structure capacitively coupled to the first conductive structure to form a second capacitor having a second capacitance that changes with a change in a distance between the first conductive structure and the third conductive structure,
      wherein the second capacitor is coupled to a second DC voltage set by the bias resistive circuit; and
   a diagnostic circuit configured to detect a first leakage current in the capacitive sensor or a second leakage current in the second capacitor by measuring a first electrical parameter that is affected by the first leakage current and measuring a second electrical parameter that is affected by the second leakage current, wherein the first electrical parameter is the first DC voltage, wherein the second electrical parameter is the second DC voltage,
      wherein the diagnostic circuit comprises a common mode amplifier and a comparator,
      wherein the common mode amplifier is configured to receive the first DC voltage, the second DC voltage, and a reference voltage, and generate a differential signal based on a difference between a common mode voltage of the first DC voltage and the second DC voltage and the reference voltage, and
      wherein the comparator is configured to compare the differential signal to a predetermined error threshold and generate an error signal in response to the differential signal being greater than the predetermined error threshold.

2. The capacitive sensor of claim 1, wherein:
   the first capacitor comprises a first terminal coupled to a bias supply voltage and a second terminal coupled to the first DC voltage set by the bias resistive circuit.

3. The capacitive sensor of claim 2, further comprising:
   a low-pass filter coupled to and between the second terminal of the first capacitor and an input of the comparator, wherein the low-pass filter is configured to provide the DC voltage as the first electrical parameter to the input of the comparator.

4. The capacitive sensor of claim 2, further comprising: a compensation circuit configured to adjust a resistance of the bias resistive circuit inversely to the DC voltage.

5. The capacitive sensor of claim 1, wherein the external force is an alternating current (AC) external force.

6. The capacitive sensor of claim 5, wherein the AC external force is one of a pressure, an acoustic wave, or a vibration.

7. The capacitive sensor of claim 1, wherein:
the second capacitor comprises a first terminal coupled to a bias supply voltage and a second terminal coupled to the second DC voltage set by the bias resistive circuit.

8. The capacitive sensor of claim 7, further comprising: a compensation circuit configured to adjust a resistance of the bias resistive circuit inversely to the DC voltage.

9. The capacitive sensor of claim 7, wherein the external force is an alternating current (AC) external force.

10. The capacitive sensor of claim 1, wherein:
the first capacitor comprises a first terminal coupled to a bias supply voltage and a second terminal coupled to the first DC voltage set by the bias resistive circuit, and
the second capacitor comprises a third terminal coupled to the bias supply voltage and a fourth terminal coupled to the second DC voltage set by the bias resistive circuit.

11. The capacitive sensor of claim 10, wherein the comparator comprises:
a first comparator configured to compare the first electrical parameter to a first predetermined error threshold and generate a first error signal in response to the first electrical parameter being greater than the first predetermined error threshold; and
a second comparator configured to compare the second electrical parameter to a second predetermined error threshold and generate a second error signal in response to the second electrical parameter being greater than the second predetermined error threshold.

12. The capacitive sensor of claim 1, further comprising: a constant charge read-out circuit coupled to an output of the first capacitor, wherein the constant charge read-out circuit is configured to maintain a constant charge of the first capacitor.

13. The capacitive sensor of claim 1, further comprising: a constant charge read-out circuit coupled to an output of the first capacitor, wherein the constant charge read-out circuit is configured to maintain a constant voltage across the first capacitor.

14. The capacitive sensor of claim 13, further comprising a trans-capacitive amplifier,
wherein the first capacitor comprises a first terminal coupled to a bias supply voltage and a second terminal coupled to the DC voltage set by a negative feedback loop of a trans-capacitive amplifier, wherein the first electrical parameter is an output voltage of the trans-capacitive amplifier that follows the DC voltage.

15. The capacitive sensor of claim 14, further comprising: a low-pass filter coupled to and between an output of the trans-capacitive amplifier and an input of the comparator, wherein the low-pass filter is configured to provide the output voltage of the trans-capacitive amplifier as the first electrical parameter to the input of the comparator.

16. A capacitive sensor, comprising:
a first conductive structure;
a second conductive structure that is counter to the first conductive structure,
wherein the second conductive structure is movable relative to the first conductive structure in response to an external force acting thereon,
wherein the second conductive structure is capacitively coupled to the first conductive structure to form a first capacitor having a first capacitance that changes with a change in a distance between the first conductive structure and second conductive structure,
wherein the first capacitance is representative of the external force, and
wherein the first capacitor comprises a first terminal coupled to a bias supply voltage and a second terminal coupled to a first DC voltage set by a bias resistive circuit;
a third conductive structure that is counter to the first conductive structure,
wherein the third conductive structure is movable relative to the first conductive structure in response to the external force acting thereon,
wherein the third conductive structure is capacitively coupled to the first conductive structure to form a second capacitor having a second capacitance that changes with a change in a distance between the first conductive structure and third conductive structure,
wherein the second capacitance is representative of the external force, and
wherein the second capacitor comprises a third terminal coupled to the bias supply voltage and a fourth terminal coupled to a second DC voltage set by the bias resistive circuit; and
a diagnostic circuit configured to detect a first leakage current in the first capacitor or a second leakage current in the second capacitor by measuring a first electrical parameter that is affected by the first leakage current and measuring a second electrical parameter that is affected by the second leakage current, respectively,
wherein the first electrical parameter is the first DC voltage, wherein the second electrical parameter is the second DC voltage,
wherein the diagnostic circuit comprises a common mode amplifier and a comparator,
wherein the common mode amplifier is configured to receive the first DC voltage, the second DC voltage, and a reference voltage, and generate a differential signal based on a difference between a common mode voltage of the first DC voltage and the second DC voltage and the reference voltage, and
wherein the comparator is configured to compare the differential signal to a predetermined error threshold and generate an error signal in response to the differential signal being greater than the predetermined error threshold.

17. The capacitive sensor of claim 16, further comprising:
a compensation circuit configured to adjust a resistance of the bias resistive circuit inversely to the differential signal.

18. The capacitive sensor of claim 16, wherein the bias resistive circuit comprises:
a first current impeding circuit coupled to and between the first DC voltage and the reference voltage; and
a second current impeding circuit coupled to and between the second DC voltage and the reference voltage.

19. The capacitive sensor of claim 18, further comprising:
a compensation circuit configured to adjust a first equivalent resistance of the first current impeding circuit and a second equivalent resistance of the second current impeding circuit inversely to the differential signal.

20. The capacitive sensor of claim 16, wherein the external force is an alternating current (AC) external force.

21. The capacitive sensor of claim 20, wherein the AC external force is one of a pressure, an acoustic wave, or a vibration.

22. The capacitive sensor of claim 16, further comprising:
a constant charge read-out circuit coupled to an output of the first capacitor, wherein the constant charge read-out circuit is configured to maintain a constant charge of the first capacitor.

23. The capacitive sensor of claim 16, further comprising:
a constant charge read-out circuit coupled to an output of the first capacitor, wherein the constant charge read-out circuit is configured to maintain a constant voltage across the first capacitor.

24. The capacitive sensor of claim 16, further comprising a trans-capacitive amplifier.

25. The capacitive sensor of claim 16, further comprising:
a low-pass filter coupled to and between an output of a trans-capacitive amplifier and an input of the comparator.

26. The capacitive sensor of claim 16, further comprising:
a low-pass filter coupled to and between the second terminal of the first capacitor and an input of the comparator.

27. A capacitive sensor, comprising:
a first conductive structure;
a second conductive structure that is counter to the first conductive structure,
    wherein the second conductive structure is movable relative to the first conductive structure in response to an external force acting thereon,
    wherein the second conductive structure is capacitively coupled to the first conductive structure to form a first capacitor having a first capacitance that changes with a change in a distance between the first conductive structure and second conductive structure, and
    wherein the first capacitance is representative of the external force;
a third conductive structure that is counter to the first conductive structure,
    wherein the third conductive structure is movable relative to the first conductive structure in response to the external force acting thereon,
    wherein the third conductive structure is capacitively coupled to the first conductive structure to form a second capacitor having a second capacitance that changes with a change in a distance between the first conductive structure and third conductive structure, and
    wherein the second capacitance is representative of the external force; and
a diagnostic circuit comprising a fully differential amplifier coupled to the first capacitor and to the second capacitor,
    wherein the fully differential amplifier is configured to generate a first signal having a first ripple indicative of a first leakage current of the first capacitor and a second signal having a second ripple indicative of a second leakage current of the second capacitor.

28. The capacitive sensor of claim 27, wherein the diagnostic circuit further comprises:
a first ripple detection circuit configured to detect the first leakage current in the first capacitor and generate a first error signal in response to detecting the first leakage current; and
a second ripple detection circuit configured to detect the second leakage current in the second capacitor and generate a second error signal in response to detecting the second leakage current.

29. The capacitive sensor of claim 28, wherein:
the first ripple detection circuit configured to calculate a first root mean square (RMS) value of the first signal, compare the first RMS value to a first predetermined error threshold, and generate the first error signal in response to the first RMS value being greater than the first predetermined error threshold, and
the second ripple detection circuit configured to calculate a second RMS value of the second signal, compare the second RMS value to a second predetermined error threshold, and generate the second error signal in response to the second RMS value being greater than the second predetermined error threshold.

30. The capacitive sensor of claim 27, wherein the diagnostic circuit is a constant voltage readout circuit configured to maintain constant voltages across the first capacitor and the second capacitor.

* * * * *